United States Patent [19]

Gray et al.

[11] 4,229,518
[45] Oct. 21, 1980

[54] PHOTOHARDENABLE ELEMENTS WITH A NON-TACKY MATTE FINISH

[75] Inventors: Russell H. Gray, Rumson, N.J.; August D. Kuchta, Sayre, Pa.

[73] Assignee: E. I. Du Pont de Nemours and Company, Wilmington, Del.

[21] Appl. No.: 703,537

[22] Filed: Jul. 8, 1976

Related U.S. Application Data

[63] Continuation-in-part of Ser. No. 342,262, Mar. 16, 1973, abandoned.

[51] Int. Cl.$^2$ .................................................. G03C 1/78
[52] U.S. Cl. ..................................... 430/273; 430/290; 430/271; 430/950
[58] Field of Search .............. 96/50 PL, 67, 68, 87 R, 96/115 R, 115 P

[56] References Cited

U.S. PATENT DOCUMENTS

| 2,976,250 | 3/1961 | Walford | 96/87 R |
| 3,582,327 | 6/1971 | Boyd et al. | 96/28 |
| 3,687,703 | 8/1972 | Ohashi et al. | 96/78 |
| 3,782,943 | 1/1974 | Hayakawa et al. | 96/48 R |
| 3,782,944 | 1/1974 | Hayakawa et al. | 96/115 P |
| 3,867,153 | 2/1975 | MacLachlan | 96/67 |

Primary Examiner—Jack P. Brammer

[57] ABSTRACT

A photohardenable element useful, for example, in color proofing and the like, additionally containing a protective top-coat comprised of tacky material, e.g. a layer containing unexposed photohardenable monomer and plasticizer, said top-coat being dusted with a powdered material capable of rendering the layer non-tacky and suitable for further handling. The powdered material additionally gives the surface of the element a matte finish.

4 Claims, No Drawings

PHOTOHARDENABLE ELEMENTS WITH A NON-TACKY MATTE FINISH

CROSS REFERENCE TO RELATED APPLICATION

This is a continuation-in-part of application Ser. No. 342,262, filed Mar. 16, 1973, now abandoned.

BACKGROUND OF THE INVENTION

1. Field of the Invention

This invention relates to image reproduction systems that employ photohardenable image forming layers which are exposed with actinic radiation or heat and dusted with pigments or dyes. More particularly, this invention relates to the use of an additional layer of photohardenable material coated thereon as a protective top coat.

2. Description of the Prior Art

The prior art describes many photopolymerizable elements, hardenable by actinic radiation, which are useful in the printing and proofing industry, for example. In many instances, after the final image bearing product is made, an additional layer of photohardenable material is laminated thereon and hardened by further over-all exposure to actinic light to form a clear, tough protective top coat over the image bearing element. A particularly useful application of this embodiment is taught by Chu and Cohen in U.S. Pat. No. 3,649,268, Mar. 14, 1972. This element is used in the color proofing industry, for example. A layer of photopolymerizable material is laminated to a support, exposed through a particular color positive to actinic radiation to selectively raise the stick temperature of those areas receiving the radiation, and the resulting image "toned" by dusting with a toner of the desired color. By repeating the lamination, exposure and toning step a four color copy of the original is achieved. A final layer of photopolymer is usually applied to the finished product, given an over-all exposure to actinic radiation to harden said layer and serve as a protective shield for subsequent handling of the finished piece. The element so produced will have a glossy appearance which is sometimes objectionable since these elements are used to prepare proofs of material for the printing industry and the printed page is not always glossy in nature. Thus, the user often desires to have a matte-like finish so that his proof most closely resembles that which is to be achieved in the final printing step. This matte finish has been difficult to achieve, particularly in the color proofing industry where, for example, the elements and processes of Chu and Cohen U.S. Pat. No. 3,649,268 are most frequently employed. One such method involves the spraying of the final image layer with a commonly used delustering agent such as "Blair Spray Dull", Blair Arts Products, Inc., Memphis, Tenn. The use of spraying agents is messy and usually involves hazardous, flammable sprays which are inconvenient and noxious. Some sprays do not often cover the layer properly and yield a poor matte finish.

Another method of achieving a matte finish is to incorporate a particulate matter in the super coat as has been well taught in the prior art. However, the conventional top coat used by the color proofing industry is a layer of unexposed photohardenable material laminated over the final image as previously described. If this particulate matter is first incorporated within the material used to prepare the top-coat it is necessary to expose the photopolymer contained therein since in its unpolymerized state it is soft and tacky and cannot be conveniently handled. Also, this step would require that a separate unit of photopolymer containing the delustering agent be maintained for this special use which would be expensive. On the other hand, if the delustering agent is applied to the tacky top-coat and subsequently exposed by the conventional methods, i.e. in a vacuum frame, the particulate matter laid down is forced into the image area causing deformation. This too is highly objectionable and cannot be tolerated.

SUMMARY OF THE INVENTION

It is an object of this invention to provide a photohardenable image reproduction element containing a protective top-coat applied thereon having a delustered or matte-like finish. A further object is to provide a top coat, which is essentially tacky in its normal state, with a dry, non-tacky surface. A still further object is to provide a delustering agent for achieving the desired matte finish and yet which is oil-absorptive so as to render the top coat non-tacky without further treatment or exposure.

These and other objects are achieved by providing an image forming layer with a tacky protective top coat contiguous thereto and applying a particulate oil-absorbing material to the surface of the protective top-coat capable of absorbing the tacky material contained therein and at the same time converting the surface to a roughened or matte-like state. The particulate oil-absorbing material may be a mixture comprised of one or more such materials.

DESCRIPTION OF THE PREFERRED EMBODIMENTS

The preferred photosensitive elements for use with the novel elements of this invention are described in U.S. Pat. No. 3,649,268. Here, a photohardenable element coated on a removable support is laminated to a suitable receptor surface, exposed imagewise to actinic radiation through said removable support which selectively raises the stick temperature of those areas receiving the radiation, the support is removed, and a colorant material is applied to the unexposed layer to develop the resulting image. Succeeding layers may be laminated, exposed image wise in register with the first image, the support stripped and the image developed with another coloring material resulting in a final multi-color reproduction of the original. To practice the invention in its preferred state a final layer of the same photohardenable material is laminated thereon, the support is stripped therefrom and the unexposed, tacky surface is dusted with a particulate matter which absorbs the unexposed monomer and plasticizing agents and renders the surface non-tacky, and at the same time causes the surface to appear matte-like. A particularly useful agent for use herein is a porous diatomaceous silica (e.g. Celite® White Mist, Johns-Manville Corp., porosity 65–85%, bulk density 19.2 lbs./solid gallon, refractive index 1.45–1.49). The element made as described above not only yields an excellent, dry finish with the desired matte-finish, but is simple and safe to use, and does not require an additional exposure step thus presenting a clear and useful improvement over the processes and methods of the prior art.

The protective layer of the invention may be applied to any surface where it is desirable to achieve a matte finish, but it is particularly useful in that color proofing system employing the photohardenable elements described in the previous Chu and Cohen patent. This system employs the steps of lamination in order to achieve color proofs and thus a laminatable top-coat using the same photohardenable element is particularly useful. The ability to transform this top-coat from a shiny finish to a permanently non-tacky matte finish using the particulate oil-absorptive materials of this invention, without a post-exposure hardening step, provides a substantial advantage over the prior art.

DETAILED DESCRIPTION OF THE INVENTION

A process of making a preferred photosensitive element of the invention comprises: (1) laminating a photosensitive element, comprising a photohardenable layer on a removable support that is transparent to actinic radiation, to a receptor surface, (2) exposing said layer imagewise through said support to actinic radiation to selectively raise the stick temperature of those areas receiving the radiation, (3) removing said support, and (4) applying colorant material to the exposed layer which adheres only to the underexposed areas of the layer to reveal a colored image. Repeating the laminating, exposing, removing and readout steps in sequence results in a multicolor image. To produce an element having a matte finish, a particulate oil-absorbing material is applied to the uppermost (i.e., the last) photohardenable layer in the same manner as the colorant is applied. The exposure step may be omitted for the uppermost layer to produce a very matte finish or may be made through a halftone screen to produce a desired degree of matte.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

Among suitable photopolymerizable or photohardenable systems are: (1) those in which a photopolymerizable monomer is present alone or in combination with a compatible binder, or (2) those in which the photopolymerizable group is attached to a polymer backbone which becomes activated on exposure to light and may then crosslink by reacting with a similar group or other reactive sites on adjacent polymer chains. In the second group of suitable photopolymerizable systems, where the monomer or pendant photopolymerizable group is capable of addition polymerization, e.g., a vinyl monomer, the photopolymerized chain length may involve addition of many similar units initiated by a single photochemical act. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a crosslinked network can be produced.

The term "underexposed" as used herein is intended to cover the image areas of the photopolymerizable layers which are completely unexposed or those exposed only to the extent that there is polymerizable compound still present in sufficient quantity that the molecular weight remains substantially lower than that of the complementary exposed image areas. The term "stick temperature" as applied to either an underexposed or exposed area of a photopolymerizable stratum means the minimum temperature at which the image area in question sticks or adheres, within 5 seconds, under slight pressure, e.g., thumb pressure, to analytical paper (Schleicher and Schull analytical filter paper No. 595) and remains adhered in a layer of at least detectable thickness after separation of the analytical paper from the stratum.

In a preferred photopolymer image reproduction element, the receptor is a material that adheres strongly to the polymer coating. Almost any material, e.g., paper, polymer, film, plastic, metal, ceramic, glass, etc., makes a suitable receptor. The only prerequisites for a receptor are that the anchorage between the receptor and the coating be greater than that between the coating and the base, and that the receptor be stable at the operating temperatures. Polyethylene fulfills the role of a suitable cover sheet since it shows a weaker adhesion to photopolymer than does polyethylene terephthalate, the base support.

The photohardenable layer thickness can vary according to the stratum composition and the material used as receptor. The number of layers of photopolymer in the element is dependent upon the image being reproduced, the desired quality of the final product, and the uses made of the final product.

Colorants used to render the image visible are similar to those described in U.S. Pat. No. 3,060,024 and U.S. Pat. Nos. 3,060,025 and 3,620,726 and the procedure for their use is fully described therein.

After one or more of the layers has been applied, given an image-wise exposure and developed by toning or dusting, or any other means for rendering the image visible, it is usually desirable to prevent damage from occurring to the image areas during any subsequent handling step. A convenient method of the prior art is to laminate another photohardenable layer, described above, directly over the image bearing system and to subsequently harden said layer by giving the structure an overall exposure to actinic radiation, usually the same source, which is rich in ultraviolet light, used for the imagewise exposure. After this exposure, the cover sheet is removed leaving a hard, glossy protective layer over the image.

In the present invention where a matte-like finish is desirable, the final layer is first laminated over the image bearing structure, the removable support is stripped therefrom without any exposure having been made, and a particulate matter of the desired characteristics is applied thereto. This particulate matter should be of the proper size needed to yield the resulting matte finish ($1.0\mu$ to $25\mu$ prefer $3\mu$ to $5\mu$). Additionally, the particulate matter must also be capable of absorbing the tacky monomer and plasticizing agents contained within the protective top-coat described above, or other pressure sensitive and adhesive-like materials in some other tacky formulation, thus rendering the surface of the protective top-coat non-tacky without the necessity of further treatment (e.g. exposure to photoharden the monomer). Any of the tacky, photohardenable or adhesive elements disclosed, for example, in U.S. Pat. No. 3,649,268 may be used to prepare a protective layer with the ambit of this invention. Other pressure sensitive, adhesive layers that are transparent may also be used as a protective top-coat. Materials useful for dusting on this layer so as to reduce the tackiness and impart a matte finish thereon must have the ability to absorb the soft, tacky material contained therein (e.g. monomer and plasticizers) and at the same time change the surface characteristics such that it will have a matte finish. Additionally, this particulate material must not absorb incident light to a degree that the color or appearance of the image bearing layer contiguous thereto is also changed from the normal.

Particulate material useful in achieving both of these desired characteristics have an average particle size between 1 and 25 microns with a preferred size of 3 to 10 microns. Additionally, they must be able to absorb at least 100%, preferably 101 to 150%, by weight of oil as determined by the Gardner-Coleman Method (A.S.T.M. D-1483-60). These materials should also be porous (65 to 85%), have a bulking value of 15 to 25 pounds per solid gallon (prefer ca. 19 lbs./solid gal.), a Screen Residue (% retention on 325 mesh average, A.S.T.M. D185-45) of 0.1 to 14 (prefer 0.1 to 1.2) and a refractive index of about 1.4 to 1.5. Such material includes particulate diatomaceous silicas and cellulose acetates pulverized to the desired particle size. A particularly useful group of materials include the diatomaceous silicas produced by Johns-Manville Products Corp. under the trade name Celite ®, Superfloss ®, and Celite ® White Mist. When any of these particulate materials are applied to a protective top-coat of tacky, photohardenable material they impart an excellent dry, non-tacky, matte finish to the surface of the top-coat. These materials are customarily applied to the tacky surface by the dusting techniques described in many of the referenced patents contained herein. It is usually best accomplished by dipping a pad of tufted material into a tray containing the delustering agent and wiping the pad over the tacky surface of the unexposed topcoat. The particulate delustering agent adheres to the tacky photohardenable layer absorbing the material therein thus reducing the tackiness of said layer. Additionally, these particles produce a roughened surface which results in the desirable matte finish. Excess material is then wiped off leaving an excellent, dry finish.

In yet another embodiment of this invention the matte surface may be altered by first exposing the photohardenable layer through a halftone dot screen, removing the strippable, temporary support, and dusting the delusterant as described above. The tacky areas of the protective layer is thus reduced, subsequently reducing the amount of matte finish. By varying the exposure and the screen used the matte finish can thus be adjusted over a wide range.

The invention is generally applicable to all photohardenable layers to which the particulate oil-absorbing material of the invention will adhere. It is particularly applicable to photopolymerizable layers which contain at least one addition-polymerizable, ethylenically unsaturated compound (monomer) and other materials such as photoinitiators, sensitizers, binders and inhibitors, which are well known in the art for use in such layers.

A large number of other polymers can be used as binders in place of or in combination with polymethylmethacrylate, e.g., polyethylmethacrylate, polyethylacrylate, polymerized acetate, polyvinyl butyrate, cellulose acetate, etc.

A large number of other polymers can also be used in place of that described herein, including triethylene glycol dimethacrylate, pentaerythritol triacrylate and any of the other addition polymerizable branched chain polyesters of an α-methylene carboxylic acid of 3-4 carbon atoms as described in U.S. Pat. No. 3,380,831.

Additionally, other materials besides colorants can be applied to the image-bearing layers, e.g., magnetic materials, electrical or heat conducting materials, hydrophilic or hydrophobic materials. Dyes may be used as colorants.

When the process of this invention is used to prepare nameplates, disperse dyes are applied to the photopolymerizable layers. These dyes must be soluble in the unpolymerized matrix and insoluble in the polymerized areas.

The exposure of the photopolymerizable element may be through line, halftone or continuous tone positive transparencies. The transparency and the element may or may not be in operative contact, and although exposure may be made through either side in the case of an element that has both support and receptor of a transparent material, in a preferred method the element is exposed through the support side.

Since most of the photohardenable materials preferred in this invention generally exhibit their maximum sensitivity in the ultraviolet range, the light source should furnish an effective amount of this radiation. Such sources include carbon arcs, mercury-vapor arcs, fluorescent lamps with special ultraviolet-emitting phosphors, argon glow lamps, electronic flash units and photographic flood lamps. Other light sources are satisfactory when material sensitive to visible light is used. The amount of exposure required depends on the type of light source used, and distance between light source and element.

An analysis of the materials which will function within the ambit of this invention, as described in the examples herein, is as follows:

| Particulate Material | Approx. Size($\mu$) | Screen Residue (ASTM D185-45) | Oil Absorption (ASTM D1483-60) |
| --- | --- | --- | --- |
| Celite ® | — | 1.0 | 105 |
| Celite ® White Mist | 7 | 1.2 | 145 |
| Super Floss ® | 5 | 0.1 | 125 |
| Avicel ® Cellulose Acetate | — | — | 110–120 |

The invention will be further illustrated by, but is not intended to be limited to, the following detailed examples:

EXAMPLE 1

A composition similar to that described in U.S. Pat. No. 3,649,268 was made containing as major ingredients in the following percent by weight:

| | |
| --- | --- |
| Methyl methacrylate polymer (approx. M.W. 30,000 density = 1.13 g/cc) | 32.4% |
| Trimethylolpropane trimethylmethacrylate (avg. M.W. approx. 1,000) | 35.6% |
| 2-o-Chlorophenyl-4,5-bis-(m-methoxyphenyl) imidazolyl dimer | 1.58% |
| 2-Mercaptobenzothiazole | 0.79% |
| Polyoxyethylene lauryl ether | 7.9% |

This material was dissolved in methylene chloride (20% solution) and coated onto a 0.001 inch thick film base of polyethylene terephthalate and provided with a cover sheet laminated thereon as described in U.S. Pat. No. 3,649,268. The cover sheet was stripped at room temperature and the photohardenable layer laminated at about 80° C. to the smooth side of Kromekote ® paper as described in U.S. Pat. No. 3,594,535. The photosensitive layer was exposed at a distance of about 27 inches through a Black Printer Positive to a NuArc ® source described in U.S. Pat. No. 3,649,268 for about 8 seconds. After stripping off the polyethylene terephthalate sheet the image was toned with a black toner prepared by dispersing a carbon black (C.I. Pigment Black 7) in cellulose acetate in the manner of U.S. Pat. No. 3,620,726 wherein the toner adhered only to those areas not exposed to light revealing the desired image. Excess toner was removed by wiping and another layer of photohardenable material was stripped of its cover sheet and laminated thereon. Without exposing, the polyethylene terephthalate sheet was removed and the surface was dusted with diatomaceous silica known as Celite ® furnished by Johns-Manville Products Corp., N.Y., N.Y. After the excess silica was removed, the surface of the protective top-coat had a pleasing matte finish that was dry to the touch. The non-tackiness of this layer was tested by placing the element so made in intimate contact with a colored print for about 24 hours at 50° C. No transfer of color was noted on this element. In contrast, another element made with a synthetic silica (submicroscopic fire-dry fumed silica, Cabot Corp., Edison, N.J.) did not yield a matte finish and the surface remained tacky. In the oven test the latter sample was severely stained due to transfer of the colored material from the print held in contact thereon.

In a like manner, several other diatomaceous silicas furnished as Superfloss ® and Celite ® White Mist by Johns-Manville Products Corp., were tested with the same, excellent results.

EXAMPLE 2

Several four color elements were prepared using the photohardenable material described in Example 1 and the procedure described in Example 1 of the Chu et al U.S. Pat. No. 3,649,268 reference. After the fourth color had been completed, each proof was covered with a protective top-coat by laminating a fifth layer of photohardenable material thereon. The control was given an overall exposure so as to harden the top-coat while the others were further treated with known delustrants to test their ability to render the surface non-tacky and with a matte finish with the following results:

| Sample | Treatment | Finish Characteristics |
| --- | --- | --- |
| Control | Non-exposed | Dry-glossy finish - did not stain in oven test* |
| 1 | Silica-gel, Syloid ®, Grace Chem. Co. | Some matte appearance - easily rubbed off - high stain in oven test* |
| 2 | Rice starch off-set powder | Fair matte appearance - rubs off - stained in oven test* |
| 3 | Cellulose Acetate (Avicel ®, FMC Corp.) | Good matte appearance - no stain in oven test* |
| 4 | Diatomaceous Silica from Example 1 | Excellent matte appearance - no stain in oven test* |

*After 24 hours in intimate contact with a color print at 50° C.

EXAMPLE 3

A photohardenable element made according to Example 1 was prepared, coated and laminated to Kromekote ® paper as described therein. A solid, test image was laid on the polyester cover sheet and exposed for about 8 seconds to the same source described in Example 1. After exposure, the cover sheet was stripped therefrom and the large, unexposed areas were toned with a cyan toner (50% phthalocyanine blue, C.I. Pigment Blue 15, and 50% cellulose acetate). Another layer of photohardenable material was laminated thereon and various portions of the resulting element were exposed for the times indicated below through half-tone screens with varying degrees of tint.

The cover sheet was removed and Celite ® White Mist (see Example 1) applied thereon to impart a matte finish and to dry the tacky areas which were unexposed. The degree of matte finish was determined using a Model 660 Photovolt Photo-electric Gloss Meter (Photovolt Corp., N.Y., N.Y.) with the following results:

| Sample | Exposure Time | Gloss Units | Finish |
| --- | --- | --- | --- |
| Control - exposed over-all | 1 min. | 100 | very high gloss |
| With 80% tint (neg) | 7 sec. | 87 | highly glossy |
| With 60% tint (neg) | " | 81 | gloss |
| With 40% tint (neg) | " | 64 | some matte finish |
| With 20% tint (neg) | " | 43 | matte |
| no exposure | | 33 | very matte |

Thus it can be seen that the degree of matte finish can be controlled over a fairly wide range by applying some exposure to the top-coat prior to the application of the particulate matter of this invention thereon. All of the above samples had a clean, dry surface.

I claim:

1. A photosensitive element comprising, in order, (1) a sheet support, (2) at least one toned, image-bearing photohardenable layer, and (3) a photohardenable protective layer having on its surface a non-tacky matte finish comprising a particulate oil-absorbing material selected from the group consisting of diatomaceous silicas and cellulose acetates having an average particle size of 1 to 25 microns, which absorbs at least 100% by weight of oil based on the weight of particulate material in the photohardenable protective layer as determined by the Gardner-Coleman Method, A.S.T.M. D-1483-60 and which does not absorb incident light to a degree that the color or appearance of the image-bearing layer contiguous thereto is changed from the normal, said photohardenable layers being comprised of a material selected from photopolymerizable, photocrosslinkable, and photodimerizable materials.

2. A photosensitive element of claim 1 wherein said photohardenable layer contains an addition-polymerizable, ethylenically unsaturated compound.

3. A photosensitive element of claim 1 wherein said photohardenable protective layer was exposed through a half-tone screen prior to application of particulate oil-absorbing material thereby reducing the degree of matte finish.

4. A photosensitive element of claim 1 wherein said element is comprised of a plurality of toned image-bearing photohardenable layers on a sheet support, the uppermost photohardenable layer having said particulate oil-absorbing material on its surface.

* * * * *